(12) United States Patent
Cheng et al.

(10) Patent No.: US 9,403,674 B2
(45) Date of Patent: Aug. 2, 2016

(54) METHODS FOR PACKAGING A MICROELECTROMECHANICAL SYSTEM (MEMS) WAFER AND APPLICATION-SPECIFIC INTEGRATED CIRCUIT (ASIC) DIES USING THROUGH MOLD VIAS (TMVS)

(71) Applicant: Taiwan Semiconductor Manufacturing Co., Ltd., Hsin-Chu (TW)

(72) Inventors: Chun-Wen Cheng, Zhubei (TW); Hung-Chia Tsai, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/457,160

(22) Filed: Aug. 12, 2014

(65) Prior Publication Data

US 2016/0046483 A1 Feb. 18, 2016

(51) Int. Cl.
*B81B 7/00* (2006.01)
*B81C 1/00* (2006.01)

(52) U.S. Cl.
CPC .............. *B81B 7/008* (2013.01); *B81C 1/0023* (2013.01); *B81B 7/0006* (2013.01); *B81B 7/0074* (2013.01)

(58) Field of Classification Search
CPC ...... B81B 7/007; B81B 7/008; B81B 7/0006; B81B 7/0032; B81B 7/0074; B81B 2201/0264; B81B 2201/0235; B81C 1/0023; B81C 1/00301; H01L 2924/1461
See application file for complete search history.

(56) References Cited

U.S. PATENT DOCUMENTS 9,237,651 B2 * 1/2016 Zhang .................... H05K 1/115
2013/0075888 A1 * 3/2013 Chang ................... B81C 1/0023
257/704

* cited by examiner

*Primary Examiner* — Armando Rodriguez
(74) *Attorney, Agent, or Firm* — Eschweiler & Associates, LLC

(57) ABSTRACT

A method for packaging a microelectromechanical system (MEMS) device with an integrated circuit die using through mold vias (TMVs) is provided. According to the method, a MEMS substrate having a MEMS device is provided. A cap substrate is secured to a top surface of the MEMS substrate. The cap substrate includes a recess corresponding to the MEMS device in a bottom surface of the cap substrate. An integrated circuit die is secured to a top surface of the cap substrate over the recess. A housing covering the MEMS substrate, the cap substrate, and the integrated circuit die is formed. A through mold via (TMV) electrically coupled with the integrated circuit die and extending between a top surface of the housing and the integrated circuit die is formed. The structure resulting from application of the method is also provided.

18 Claims, 15 Drawing Sheets

METHODS FOR PACKAGING A MICROELECTROMECHANICAL SYSTEM (MEMS) WAFER AND APPLICATION-SPECIFIC INTEGRATED CIRCUIT (ASIC) DIES USING THROUGH MOLD VIAS (TMVS)

BACKGROUND

Microelectromechanical system (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
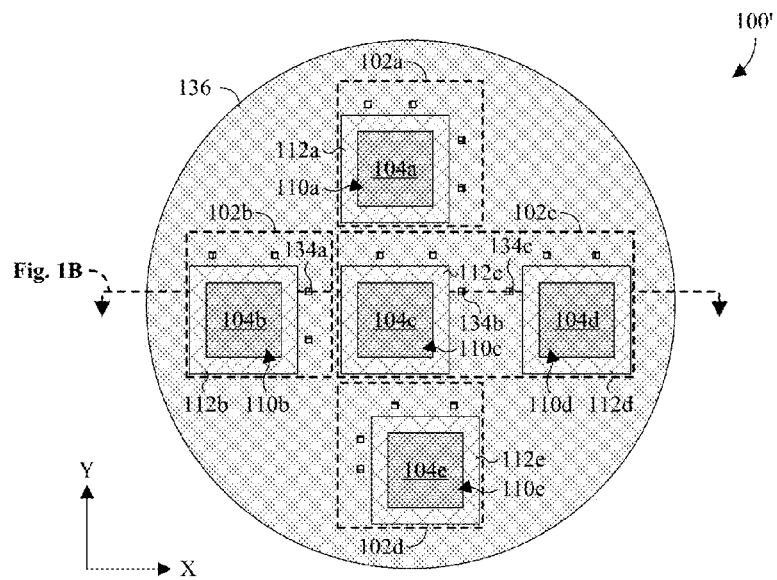
FIG. 1A illustrates a top view of some embodiments of a structure having a plurality of microelectromechanical system (MEMS) packages, the structure including a MEMS wafer, a cap wafer, application-specific integrated circuits (ASIC) dies, and through mold vias (TMVs) collectively defining the MEMS packages.
Figure 1B:
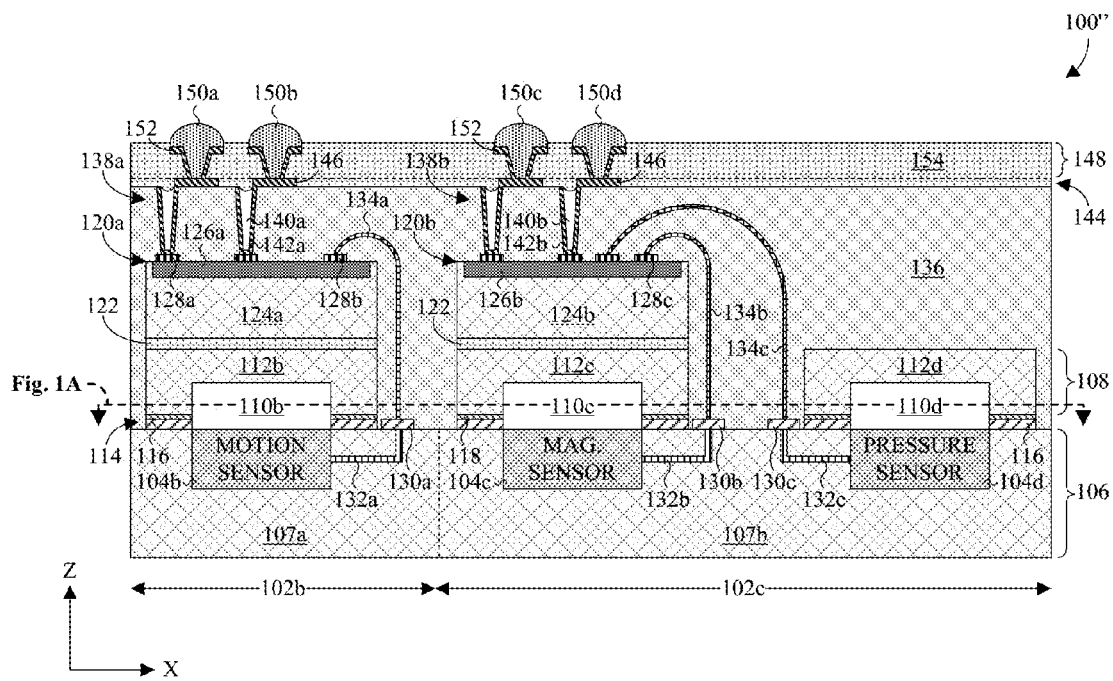
FIG. 1B illustrates a cross-sectional view of some embodiments of the structure of FIG. 1A.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To an increasing extent, modern day electronic devices are incorporating microelectromechanical system (MEMS) devices, such as accelerometers or gyroscopes, for numerous applications. For many applications, the MEMS devices are electrically connected to, and packaged with, application-specific integrated circuits (ASICs) that serve as interfaces between the MEMS devices and the electronic devices. The bulk manufacture of MEMS devices and ASICs has been one of the key enabling technologies for the increasing use of MEMS devices within electronic devices.

During the bulk manufacture of MEMS devices, a plurality of MEMS devices is formed over and/or within a MEMS wafer, typically 8 inches in diameter. Thereafter, a cap wafer having the same or a similar diameter as the MEMS wafer is arranged over and secured to the MEMS wafer. The bottom surface of the cap wafer includes recesses corresponding to the MEMS devices. When the cap wafer is arranged over and secured to the MEMS wafer, chambers including the recesses are formed over and abutting corresponding MEMS devices between the MEMS and cap wafers. The combined MEMS and cap wafers are then singulated or diced to form individual MEMS dies, each including at least one MEMS device.

Similar to MEMS devices, during the bulk manufacture of ASIC devices, a plurality of ASICs is formed over and/or within an ASIC wafer, typically 12 inches in diameter. Further, the plurality of ASICS is typically formed using complementary metal-oxide-semiconductor (CMOS) technology. The ASIC wafer is then singulated or diced to form individual ASIC dies, each including at least one ASIC.

To package a bulk manufactured ASIC and a bulk manufactured MEMS device together for use within an electronic device, according to some methods, an ASIC die corresponding to the ASIC is arranged over a substrate. Further, a MEMS die corresponding to the MEMS device is arranged over the ASIC. With the MEMS die arranged atop the ASIC die, the ASIC die and the MEMS die are connected to each other and/or the substrate by, for example, wire bonding. A housing is then molded over and around the ASIC die and the MEMS die.

A challenge with packaging the ASIC and the MEMS device according to the foregoing methods is that the package has a big footprint. It takes a lot of area when incorporated into an electronic device. Another challenge with packaging the ASIC and the MEMS device according to the foregoing methods is that it's difficult to reduce the height of the package. In view of the foregoing, the present disclosure is directed to an improved method for packaging bulk manufactured ASICs and a bulk manufacture MEMS devices together, as well as the resulting package structure.

According to the improved method, a cap wafer is arranged over and secured to a MEMS wafer including a plurality of MEMS devices. The cap wafer includes caps corresponding to the MEMS devices and typically spaced in at least one dimension. Each cap is associated with a recess in a bottom surface of the cap wafer and corresponds to those regions of the cap wafer surrounding the recess. ASIC dies are then respectively arranged over and secured to top surfaces of the caps. In some embodiments, wire bonds are also formed between the MEMS wafer and the ASIC dies. Thereafter, a housing is formed over and around the MEMS and cap wafers, and the ASIC dies. Further, through mold vias (TMVs) are formed to the ASICs dies and, in some embodiments, the MEMS wafer. With the TMVs formed, a redistribution layer (RDL) is formed over the housing in electrical communication with the ASIC dies and/or the MEMS wafer by way of the TMVs. Further, a ball grid array (BGA) is formed over the RDL and in electrical communication with the RDL, thereby resulting in a plurality of MEMS packages integrated into a common structure. The common structure is diced or singulated to separate the packages.

The improved method describes an approach to packaging bulk manufactured ASICs and bulk manufacture MEMS devices by connecting ASIC dies to a MEMS wafer. No method for packaging bulk manufactured ASICs with bulk manufactured MEMS devices is known to perform such packaging between MEMS devices at the wafer level and ASICs at the die level. Advantageously, because MEMS dies and ASIC dies are not stacked over a substrate for packaging, the form factor of individual packages is improved. Both the foot print and the height of the individual packages is reduced. Further, the improved method advantageously extends the performance of MEMS devices with ASICs.

With reference to FIGS. 1A & B, top and cross-sectional views 100', 100" are respectively illustrated for some embodiments of a plurality of MEMS packages 102a-d. The MEMS packages 102 are shown as being integrated together into a common structure, described in detail hereafter. However, in practice, the common structure is diced to separate the MEMS packages 102 for individual use. Further, although the common structure is illustrated with 4 MEMS packages 102, more or less packages are amenable.

The MEMS packages 102 include corresponding MEMS devices 104a-e arranged over and/or within a top surface of a MEMS wafer 106 acting as a substrate for the MEMS devices 104. Each MEMS package 102 includes at least one MEMS device 104 and, in some embodiments, more than one MEMS device 104. Further, each MEMS package 102 includes a portion (or region) 107a, 107b of the MEMS wafer 106 (acting as a substrate) within or over which the corresponding MEMS devices 104 are arranged. The MEMS devices 104 include, for example, one or more of gyroscopes, accelerometers, microphones, pressure sensors, motion sensors, and magnetic sensors. The MEMS wafer 106 is, for example, a bulk silicon wafer and/or is, for example, an 8 inch wafer.

A cap wafer 108 is arranged over and bonded to the MEMS wafer 106 to define chambers 110a-e over and abutting corresponding MEMS devices 104. The cap wafer 108 includes caps 112a-e corresponding to the MEMS devices 104 and recesses in the bottom surface of the cap wafer 108 corresponding to the MEMS devices 104. Each cap 112 is associated with one or more of these recesses and corresponds to those regions of the cap wafer 108 surrounding the one or more of these recesses. In some embodiments, the caps 112 are individual to the recesses and/or the MEMS devices 104. Further, in some embodiments, the caps 112 are laterally spaced in at least one dimension. For example, the cap wafer 108 can be partially or fully singulated or diced (e.g., into dies corresponding to the caps) to space the caps 112. Each of the chambers 110 is defined between a corresponding cap 112 and the MEMS wafer 106. In some embodiments, the chambers 110 include a chamber 110 for each MEMS device 104. Further, in some embodiments, the chambers 110 wholly or substantially cover the MEMS devices 104. The cap wafer 108 is, for example, a bulk silicon wafer and/or is, for example, an 8 inch wafer.

The cap wafer 108 is bonded to the MEMS wafer 106 by way of a cap bonding structure 114 arranged outside of the chambers 110 between the MEMS and cap wafers 106, 108. In some embodiments, the cap bonding structure 114 includes a first cap bonding substructure 116 and a second cap bonding substructure 118 abutting the first cap bonding substructure 116. The first cap bonding substructure 116 is arranged over the top surface of the MEMS wafer 106, and the second cap bonding substructure 118 is arranged over the bottom surface of the cap wafer 108. The first cap bonding substructure 116 is, for example, comprised of aluminum copper (AlCu), and the second cap bonding substructure 118 is, for example, comprised of germanium (Ge).

The MEMS packages 102 further include corresponding ASIC dies 120a, 120b arranged over and bonded to top surfaces of corresponding caps 112 of the cap wafer 108. Each MEMS package 102 includes at least one ASIC die 120 and, in some embodiments, more than one ASIC die 120. The ASIC dies 120 are bonded to the top surfaces of the corresponding caps 112 by an ASIC bonding structure 122 comprising, for example, an epoxy. Further, the ASIC dies 120 each include a substrate 124a, 124b, such as silicon substrate, and one or more ASICs 126a, 126b over and/or within a top surface of the substrate 124.

The ASICs 126 of the ASIC dies 120 include logic devices (e.g., CMOS transistors) to operate the MEMS devices 104 and provide an interface between the MEMS devices 104 and external electronic devices. Typically, there is a one-to-one coupling between the ASICs 126 and the MEMS devices 104, but a one-to-many coupling is also contemplated. Further, the ASICs 126 are associated with ASIC bond pads 128a-c arranged over the ASICs 126 to facilitate an electrical connection with the ASICs 126. For readability, only some of the ASIC bond pads 128 are specifically labeled. The ASIC bond pads 128 are, for example, metal.

In some embodiments, MEMS bond pads 130a-c are arranged over the top surface of the MEMS wafer 106 between the caps 112 of the cap wafer 108 and between the cap bonding structure 114. Further, MEMS interconnects 132a-c are arranged within the MEMS wafer 106 to electrically couple the MEMS bond pads 130 to the MEMS devices 104, and wire bonds 134a-c are arranged between the MEMS bond pads 130 and the ASIC bond pads 128 to electrically couple the ASICs 126 to the MEMS devices 104. The wire bonds 134 have, for example, a diameter of about 25-70 micrometers and/or are, for example, comprised of copper. For readability, only some of the wire bonds 134 are specifically labeled. The MEMS interconnects 132 are, for example, comprised of polysilicon. The MEMS bond pads 130 are, for example, comprised of AlCu.

A housing 136, typically a molded housing, is arranged over and around (e.g., encapsulating) the ASIC dies 120, the cap wafers 108, and the MEMS wafer 106. In some embodiments, the housing 136 includes a planar top surface. TMVs 138a, 138b extend from the top surface of the housing 136 into the housing 136 to corresponding AISCs 126 or corresponding ASIC bond pads 128. The TMVs 138 each include a TMV hole 140a, 140b extending into the housing 136 from the top surface of the housing 136 to a corresponding ASIC bond pad 128 or a corresponding ASIC 126. Further, the TMVs 138 each include a TMV interconnect 142a, 142b lining or otherwise filling the TMV hole 140 to provide an electrical connection to the corresponding ASIC bond pad 128. For readability, only some of the TMVs 138 and some of the individual components 140, 142 of the TMVs 138 are specifically labeled.

A redistribution layer (RDL) 144 is arranged over the top surface of the housing 136 and includes an RDL conductive structure 146 to electrically connect the ASICs 126, by way of the TMV interconnects 142, to a ball grid array (BGA) 148. The BGA 148 is arranged over the RDL 144 and includes a plurality of solder balls 150a-d electrically connected to the RDL 144 by way of a BGA conductive structure 152. A RDL/BGA bonding structure 154 is arranged over the RDL 144 and around the BGA 148 to bond the RDL 144 and the BGA 148 to the housing 136 and/or otherwise protect the RDL 144 and the BGA 148. The RDL/BGA bonding structure 154 is, for example, an epoxy.

Figure 2A:
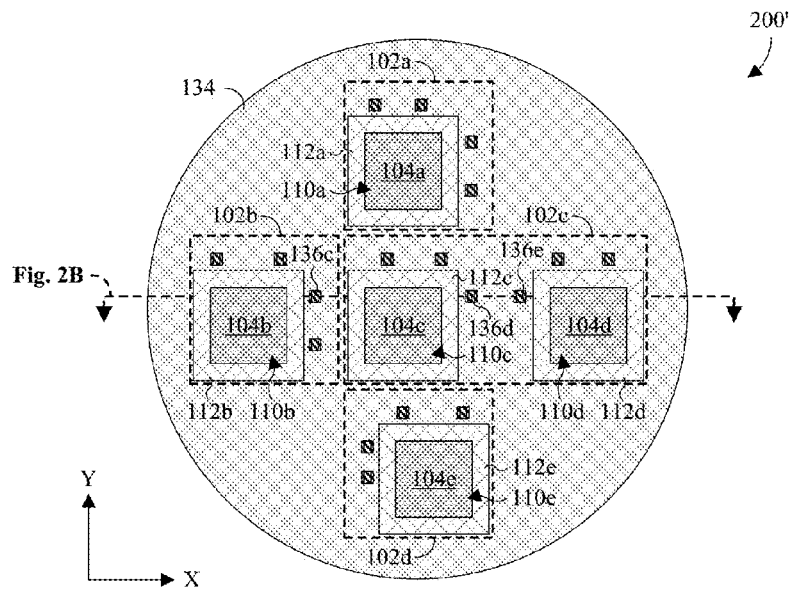
FIG. 2A illustrates a top view of some embodiments of a structure having a plurality of MEMS packages, the structure including a MEMS wafer, a cap wafer, ASIC dies, and TMVs collectively defining the MEMS packages.
Figure 2B:
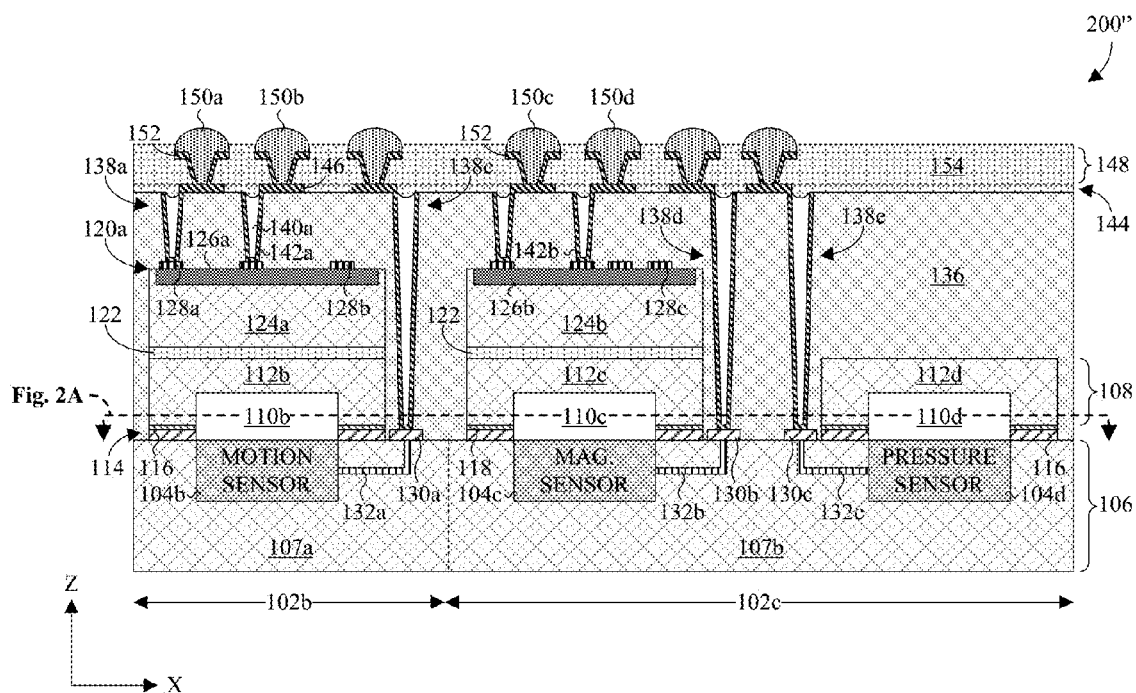
FIG. 2B illustrates a cross-sectional view of some embodiments of the structure of FIG. 2A.

With reference to FIGS. 2A & B, top and cross-sectional views 200', 200" are respectively illustrated for alternative embodiments of the plurality of MEMS packages 102. In contrast with the embodiments of FIGS. 1A & B, the present embodiments do not employ wire bonding. Rather, the present embodiments employ additional TMVs 138c-e (only some of which are shown for readability) to connect the MEMS bond pads 130 to the RDL 144 and, in some embodiments, the BGA 148. The ASICs 126 can then be connected to the MEMS devices 104 by the RDL 144 or externally by way of the BGA 148.

Advantageously, by packaging MEMS devices at the wafer level, as opposed to the die level, the form factors of resulting MEMS packages are improved. Namely, because the MEMS dies and the ASIC dies are not arranged over additional substrates for packaging, the footprints of the MEMS packages are reduced. Similarly, the heights of the MEMS packages are reduced. Whereas the heights of known MEMS packages were defined partially by the heights of the additional substrates over which the ASIC and MEMS dies were arranged, the MEMS packages described herein do not have such additional substrates and thus have reduced heights compared to known packages.

As described above, in some embodiments, the common structure illustrated in FIGS. 1A & B, as well as FIGS. 2A & B, is singulated. In such embodiments, the MEMS substrate 106 and the cap wafer 108 are separated into discreet, independent regions corresponding to the MEMS packages 102. Each MEMS package 102 includes the corresponding region of the MEMS substrate 106 and the corresponding region of the cap wafer 108. The corresponding regions of the MEMS and cap wafers 106, 108 of MEMS package 102 are respectively MEMS and cap substrates for the MEMS package 102.

Figure 3:
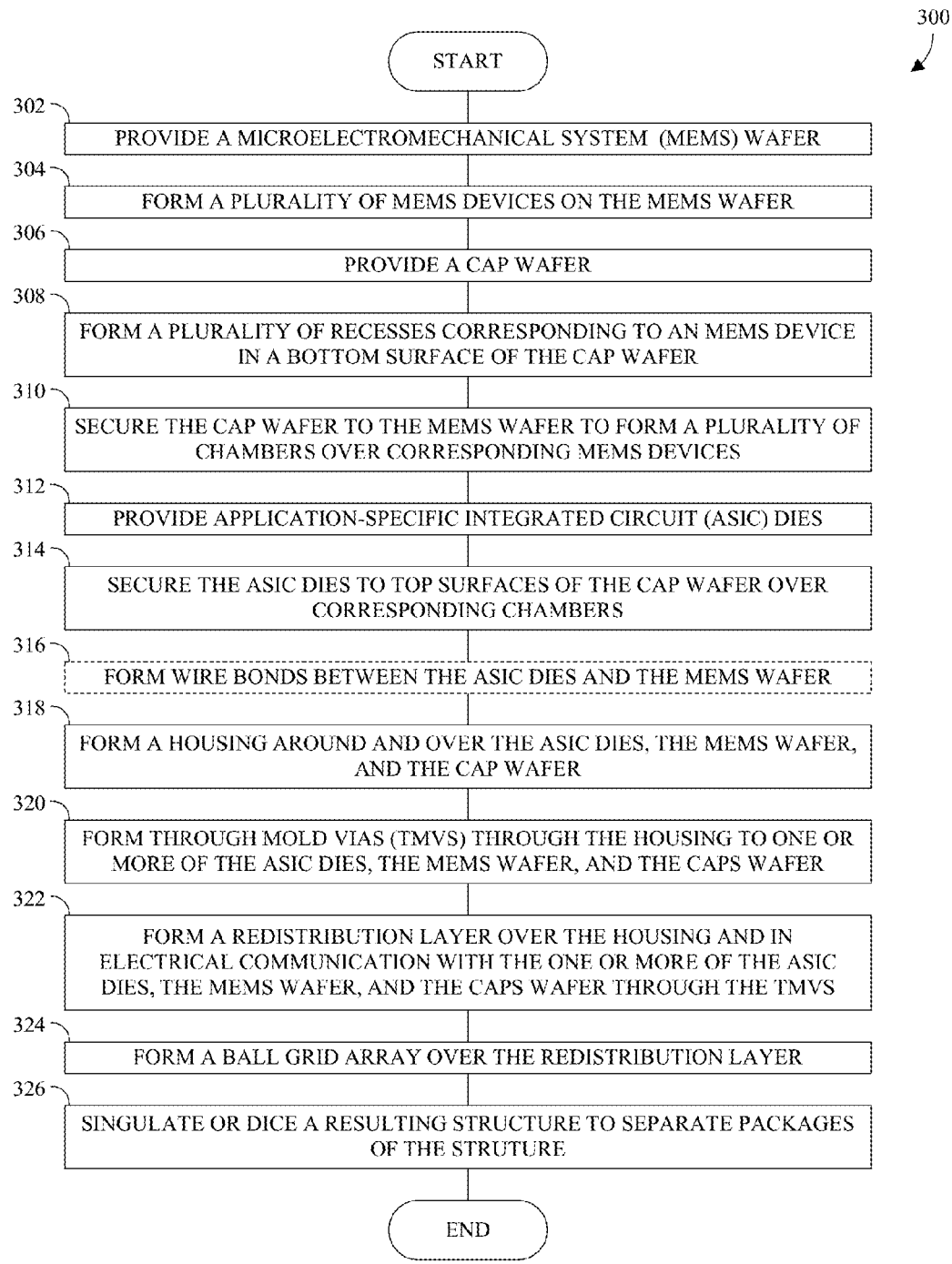
FIG. 3 illustrates a flow chart of some embodiments of a method of manufacturing of a structure having a plurality of MEMS packages, the structure including a MEMS wafer, a cap wafer, ASIC dies, and TMVs collectively defining the MEMS packages.

With reference to FIG. 3, a flow chart 300 of some embodiments of a method for manufacturing MEMS packages is provided. According to the method, a MEMS wafer is provided (Action 302). A plurality of MEMS devices are formed (Action 304) on the MEMS wafer. A cap wafer is provided (Action 306). A plurality of recesses corresponding to a MEMS device are formed (Action 308) in a bottom surface of the cap wafer. The cap wafer is secured (Action 310) to the MEMS wafer to form a plurality of chambers over corresponding MEMS devices. ASIC dies are provided (Action 312). The ASIC dies are secured (Action 314) to top surfaces of the cap wafer over corresponding chambers. In some embodiments, wire bonds are formed (Action 316) between the ASIC dies and the MEMS wafer. A housing is formed (Action 318) around and over the ASIC dies, the MEMS wafer, and the cap wafer. TMVs formed (Action 320) through the housing to one or more of the ASIC dies, the MEMS wafer, and the cap wafer. A RDL is formed (Action 322) over the housing and in electrical communication with the one or more of the ASIC dies, the MEMS wafer, and the cap wafer through the TMVs. A BGA is formed (Action 324) over the RDL. A resulting structure comprising the housing and the MEMS wafer is singulated or diced to separate or space MEMS packages of the structure.

While the disclosed methods (e.g., the method described by the flowchart 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 4-26, cross-sectional views of some embodiments of MEMS packages at various stages of manufacture are provided to illustrate the method. Although FIGS. 4-26 are described in relation to the method, it will be appreciated that the structures disclosed in FIGS. 4-26 are not limited to the method, but instead may stand alone as structures independent of the method. Similarly, although the method is described in relation to FIGS. 4-26, it will be appreciated that the method is not limited to the structures disclosed in FIGS. 4-26, but instead may stand alone independent of the structures disclosed in FIGS. 4-26.

Figure 4:
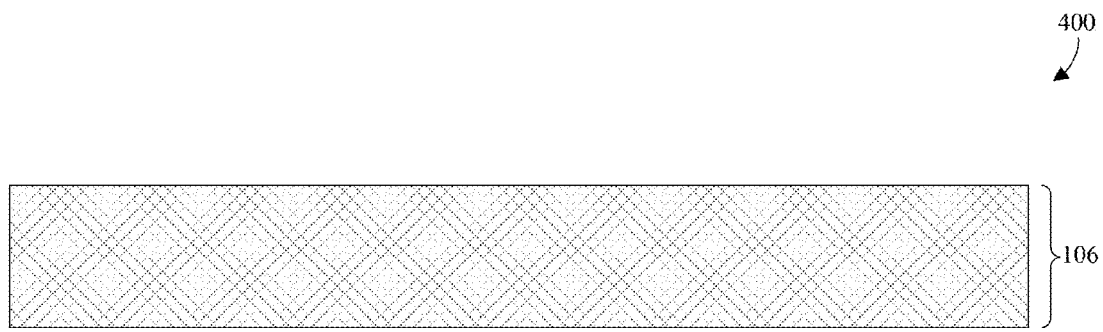
FIGS. 4-26 illustrate a series of cross-sectional views of some embodiments of a structure having a plurality of MEMS packages at various stages of manufacture, the structure including a MEMS wafer, a cap wafer, ASIC dies, and TMVs collectively defining the MEMS packages.

FIG. 4 illustrates a cross-sectional view 400 of some embodiments corresponding to Action 302. As shown by FIG. 4, a MEMS wafer 106 is provided. The MEMS wafer 106 is, for example, a bulk silicon wafer and/or is, for example, an 8 inch wafer.

Figure 5:
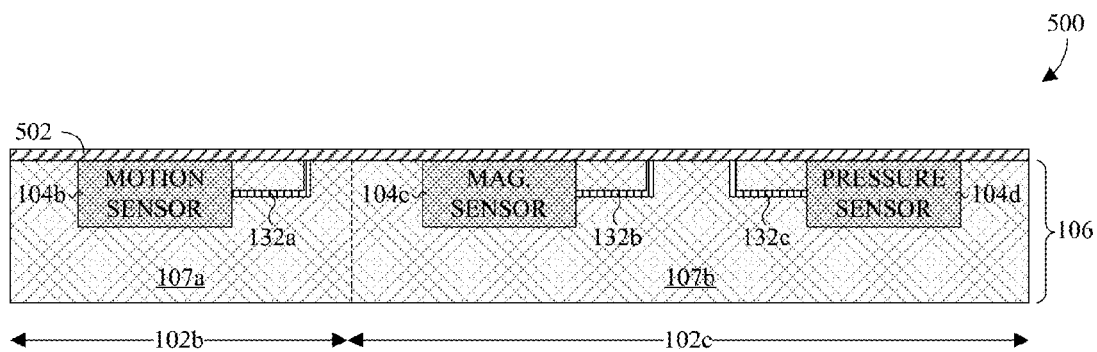

FIG. 5 illustrates a cross-sectional view 500 of some embodiments corresponding to Action 304. As shown by FIG. 5, a plurality of MEMS devices 104b-d corresponding to MEMS packages 102b, 102c are formed over and/or within a top surface of the MEMS wafer 106. The MEMS devices 104 are each formed in a portion (or region) 107a, 107b of the MEMS wafer 106 corresponding to the MEMS package 102 of the MEMS device 104. The portions 107 of the MEMS wafer 106 serve as substrates for the MEMS device 104. The MEMS devices 104 include, for example, one or more of gyroscopes, accelerometers, microphones, pressure sensors, motion sensors, and magnetic sensors. Further, the MEMS devices 104 are formed according to well-known techniques, such as photolithography techniques.

Also shown by FIG. 5, MEMS interconnects 132a-c electrically coupled to the MEMS devices 104 and extending from the MEMS devices 104 to the top surface of the MEMS wafer 106 are formed. Further, a first cap bonding layer 502 is formed over top surfaces of the MEMS wafer 106 and the MEMS devices 104. The first cap bonding layer 502 is, for example, aluminum (Al) or Ge for eutectic bonding, oxide for fusion bonding, and a metal or a polymer for thermal compression bonding. The MEMS interconnects 132 are, for example, comprised of polysilicon.

Figure 6:
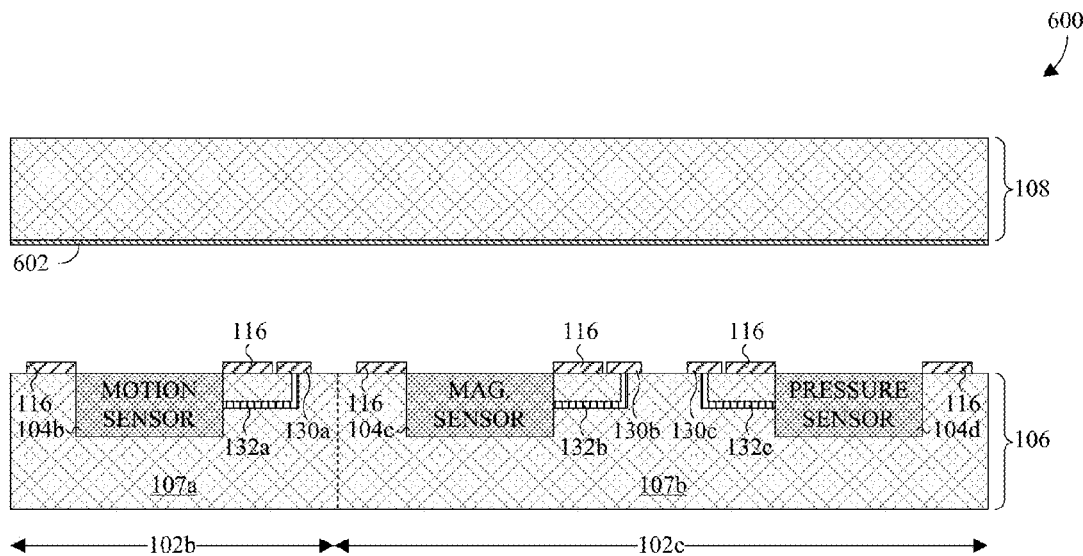

FIG. 6 illustrates a cross-sectional view 600 of some embodiments corresponding to Action 306. As shown by FIG. 6, a cap wafer 108 is provided with a second cap bonding layer 602 formed over the bottom surface. The cap wafer 108 is, for example, a bulk silicon wafer and/or is, for example, an 8 inch wafer. Typically, the cap wafer 108 and the MEMS wafer 106 share the same width and the same length, or the same diameter. The second cap bonding layer 602 is, for example, aluminum (Al) or Ge for eutectic bonding, oxide for fusion bonding, and a metal or a polymer for thermal compression bonding.

Also shown by FIG. 6, an etch is performed through portions of the first cap bonding layer 502 to form a first cap bonding substructure 116 over the top surface of the MEMS wafer 106 around the periphery of the MEMS devices 104. The etch further forms MEMS bond pads 130a-c over the top surface of the MEMS wafer 106 that are electrically coupled with the MEMS interconnects 132.

Figure 7:
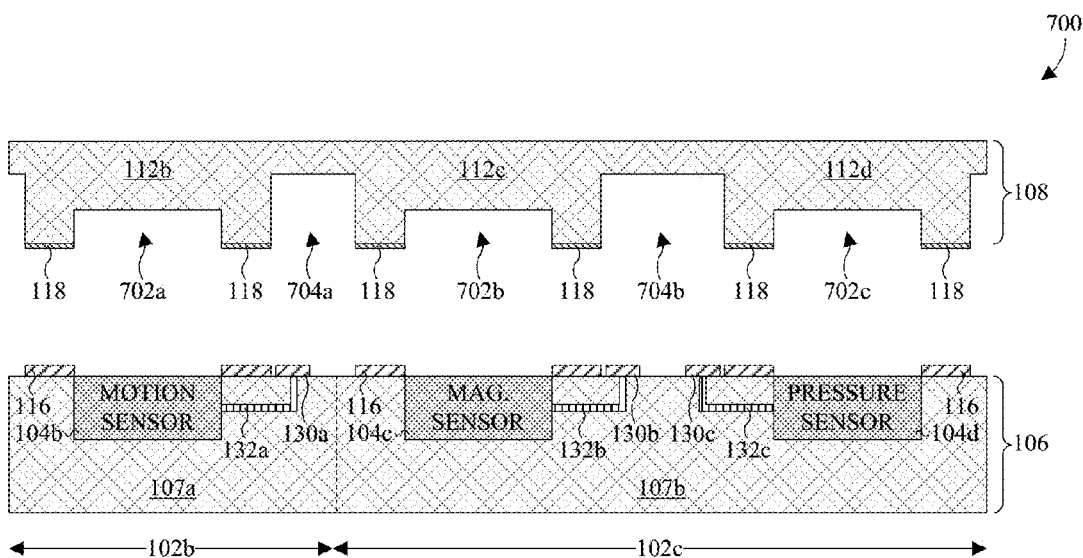

FIG. 7 illustrates a cross-sectional view 700 of some embodiments corresponding to Action 308. As shown by FIG. 7, a plurality of MEMS recesses 702a-c corresponding to the MEMS devices 104 are formed in the bottom surface of the cap wafer 108. The widths and lengths of the openings of the MEMS recesses 702 are typically equal to or larger than the respective widths and lengths of the MEMS devices 104. Also, shown by FIG. 7, in some embodiments, spacing recesses 704a-c having a greater depth than the MEMS recesses 702 and spaced between the MEMS recesses 702 are formed in the bottom surface of the cap wafer 108.

In forming the spacing and MEMS recesses 702, 704, a second cap bonding substructure 118 is formed on the bottom surface of the cap wafer 108 between the spacing and MEMS recesses 702, 704. Further, caps 112b-d corresponding to the MEMS recesses 702 and surrounding the corresponding MEMS recesses 702 are also formed. A cap 112 corresponding to a MEMS recess 702 is defined by those portions of the cap wafer 108 surrounding the sidewalls and the top surface of the MEMS recesses 702. The spacing and MEMS recesses 702, 704 are formed by, for example, performing one or more etches through the second cap bonding layer 602 and into the bottom of the cap wafer 108.

Figure 8:
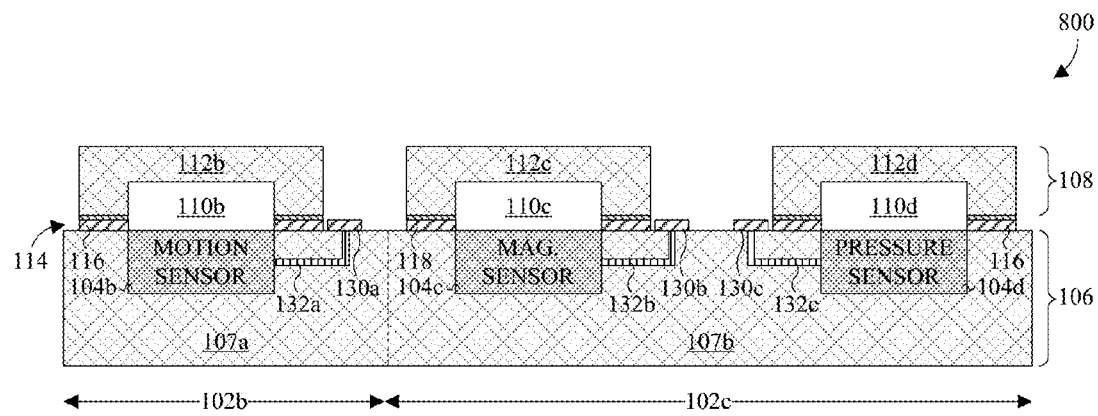

FIG. 8 illustrates a cross-sectional view 800 of some embodiments corresponding to Action 310. As shown by FIG. 8, the cap wafer 108 is secured to the MEMS wafer 106 by the first and second cap bonding substructures 116, 118. Collectively the first and second cap bonding substructures 116, 118 form a cap bonding structure 114. When the cap wafer 108 is secured to the MEMS wafer 106, chambers 110b-d are formed over and abutting the MEMS devices 104 between the cap wafer 108 and the MEMS wafer 106. The chambers 110 are, for example, hermetically sealed, and/or, for example, fully or substantially cover the MEMS devices 104. Also shown by FIG. 8, in some embodiments, a planarization is performed into the cap wafer 108 to top surfaces of the spacing recesses 704. The planarization partially or fully singulates the cap wafer to separate or space the caps 112.

Figure 9:
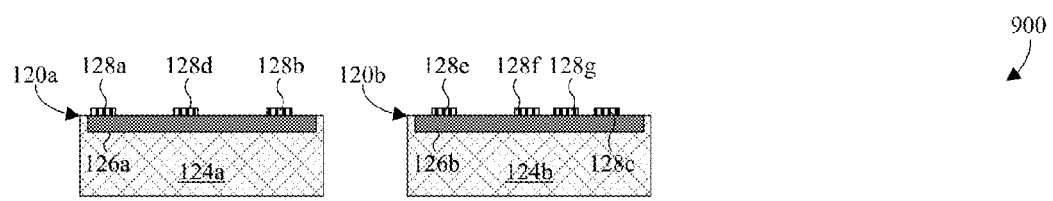
Figure 9:
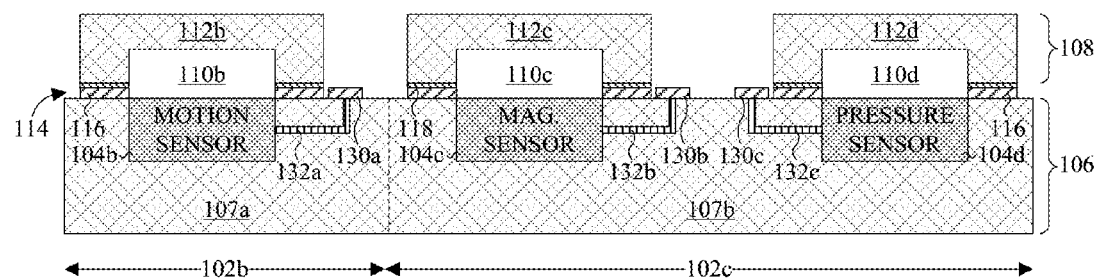

FIG. 9 illustrates a cross-sectional view 900 of some embodiments corresponding to Action 312. As shown by FIG. 9, ASIC dies 120a, 120b corresponding to the MEMS devices 104 are provided. The ASIC dies 120 each include a substrate 124a, 124b, such as silicon substrate, and one or more ASICs 126a, 126b over and/or within a top surface of the substrate 124. Further, the ASIC dies 120 include ASIC bond pads 128a-g arranged over the ASICS 126 to facilitate an electrical connection with the ASICS 126. The ASIC dies 120 are, for example, formed using CMOS technology and/or on a 12 inch wafer. The ASIC bond pads 128 are, for example, metal.

Figure 10:
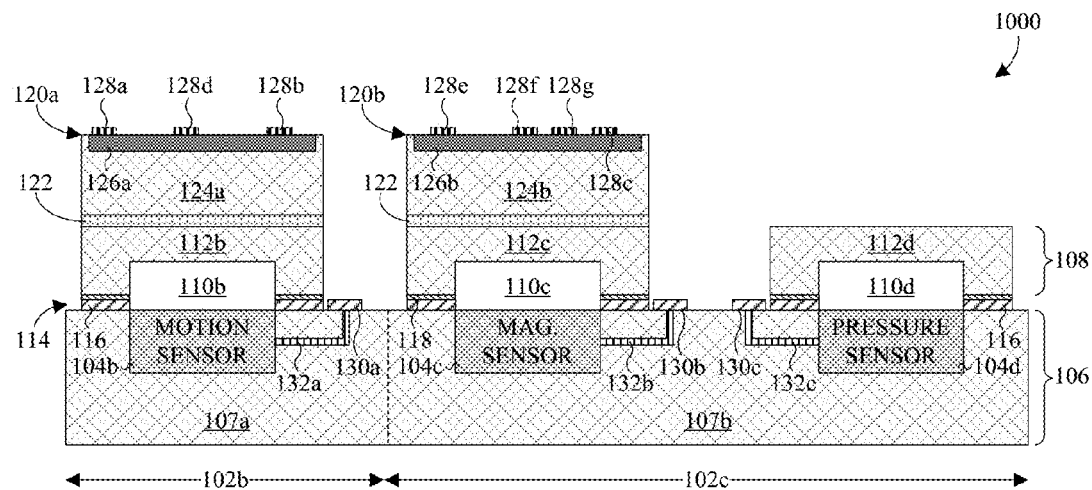

FIG. 10 illustrates a cross-sectional view 1000 of some embodiments corresponding to Action 314. As shown by FIG. 10, the ASIC dies 120 are secured over corresponding chambers 110 to the top surfaces of corresponding caps 112 by an ASIC bonding structure 122 arranged between the bottom surfaces of the ASIC dies 120 and the top surface of the MEMS wafer 106. The ASIC bonding structure 122 is, for example, an epoxy.

With reference to FIGS. 11-18, cross-sectional views 1100-1800 of some embodiments corresponding to Actions 316-326 are illustrated.

Figure 11:
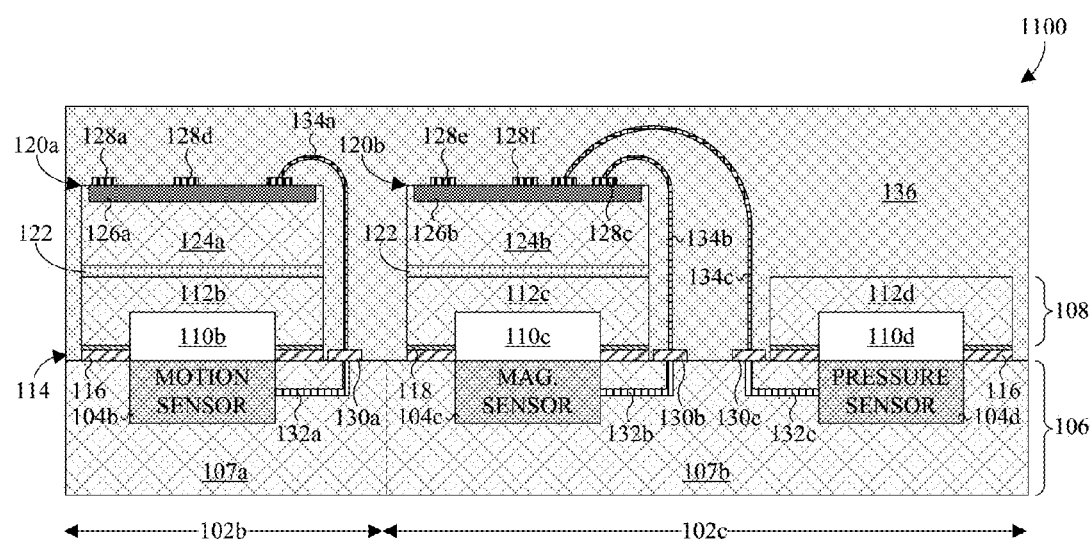

FIG. 11 illustrates a cross-sectional view 1100 of some embodiments corresponding to Actions 316 and 318. As shown by FIG. 11, wire bonds 134a-c are formed between the MEMS bond pads 130 and the ASIC bond pads 128 to electrically couple the ASICs 126 to the MEMS devices 104. The wire bonds 134 are, for example, formed of copper. Further, a housing 136 is formed over and around the cap wafer 108, the MEMS wafer 106, and the ASIC dies 120. The housing 136 is typically formed by a molding process in which a molding material is formed and subsequently thinned down or planarized down.

Figure 12:
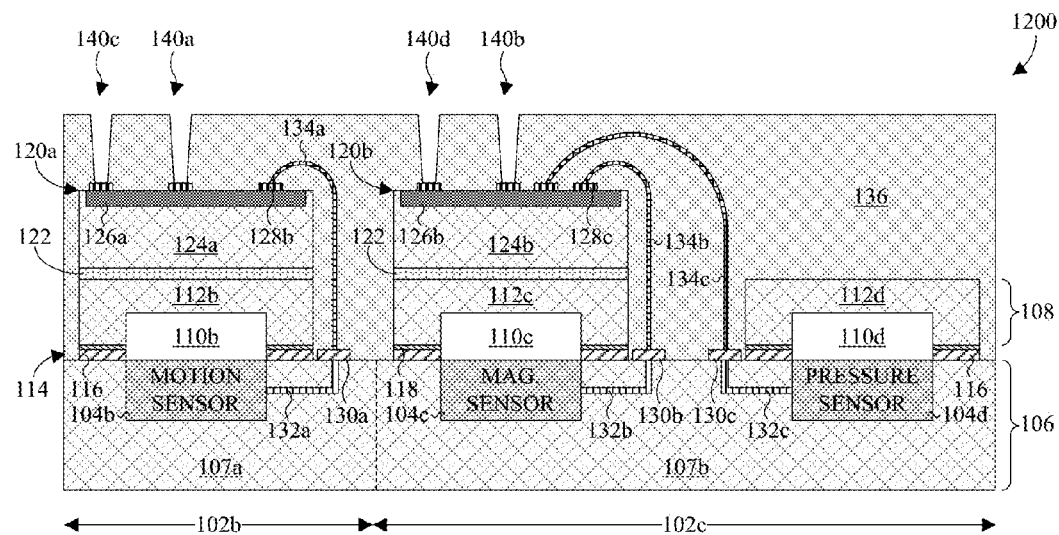
Figure 13:
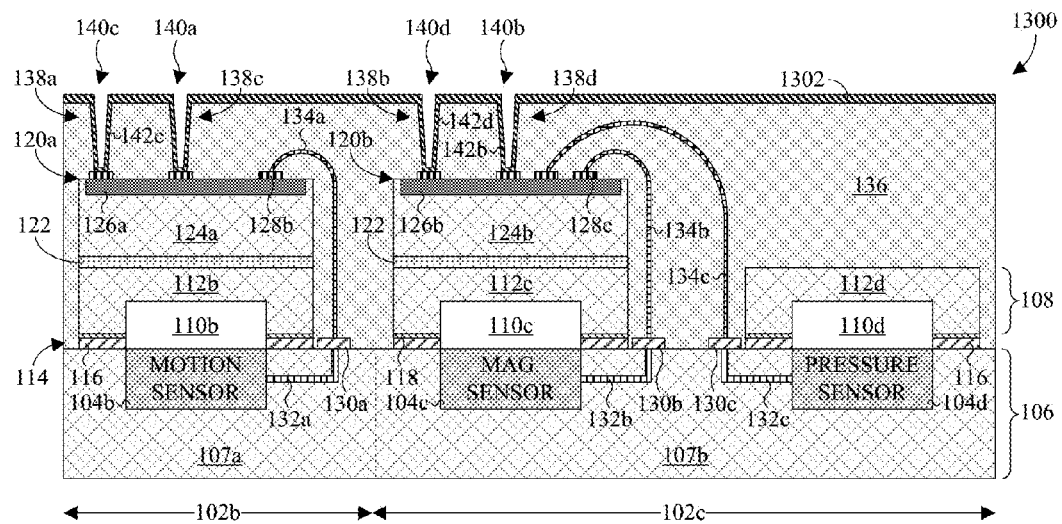

FIGS. 12 and 13 respectively illustrate cross-sectional views 1200, 1300 of some embodiments corresponding to Action 320. As shown by FIG. 12, TMV holes 140a-d are formed through portions of the housing 136 to ASIC bond pads 128 facilitating an electrical connection with the ASICs 126. The TMV holes 140 can, for example, be formed by performing an etch through the portions of the housing 136. As shown by FIG. 13, a first conductive layer 1302 is conformally formed over the top surface of the housing 136 and lining the TMV holes 140. In other embodiments, the first conductive layer 1302 is formed over the top surface of the housing 136 and filling the TMV holes 140. Portions of the first conductive layer 1302 lining or otherwise filling the TMV holes 140 define TMV interconnects 142a-d. The TMV holes 140 and the TMV interconnects 142 collectively define TMVs 138a-d electrically connecting to the ASIC dies 120.

Figure 14:
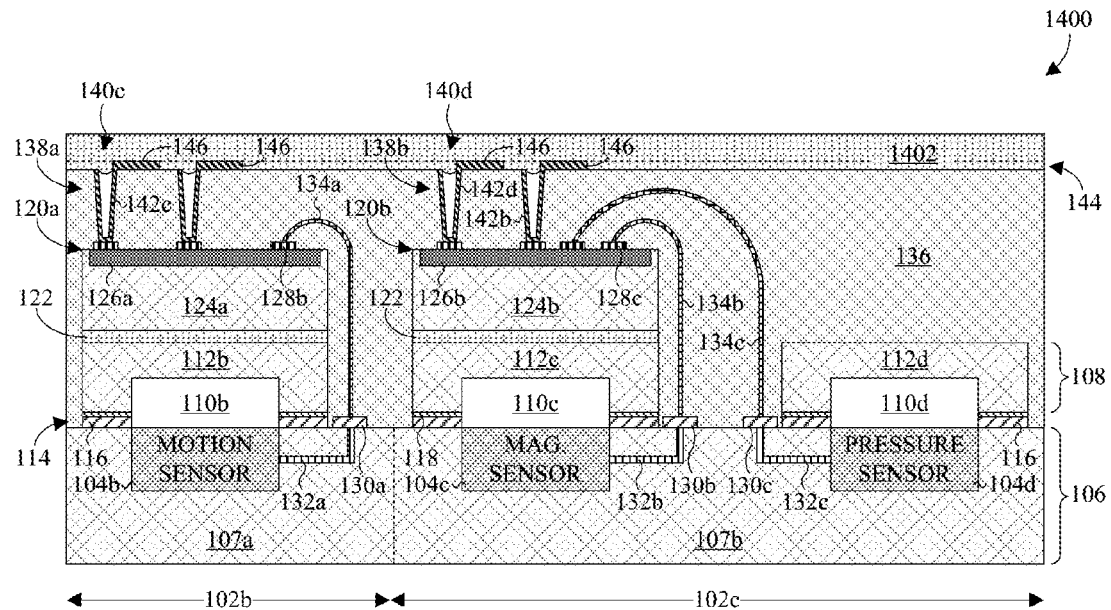

FIG. 14 illustrates a cross-sectional view 1400 of some embodiments corresponding to Action 322. As shown by FIG. 14, the first conductive layer 1302 is selectively patterned to form a RDL 144 having a RDL conductive structure 146 over the top surface of the housing 136. The RDL 144 electrically connects with ASICs 126 by way of the TMVs 138 and the ASIC bond pads 128, and distributes electrical connection points to the ASICs 126 across the top surface of the housing 136 with the RDL conductive structure 146. Also show by FIG. 14, an RDL bonding layer 1402 is formed over the RDL 144. The RDL bonding layer 1402 is, for example, an epoxy.

Figure 15:
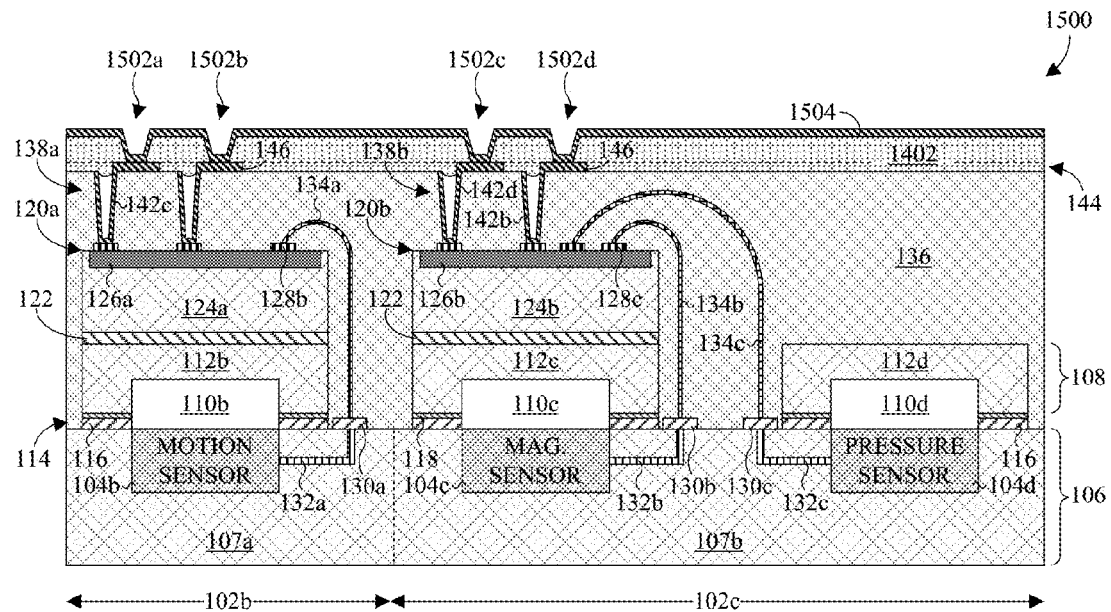
Figure 16:
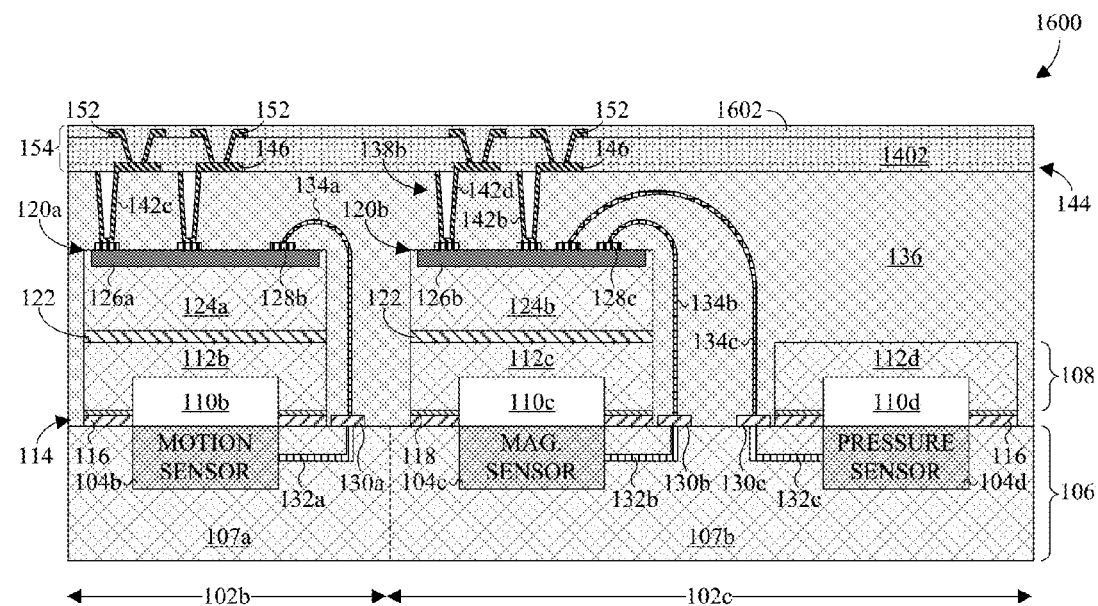
Figure 17:
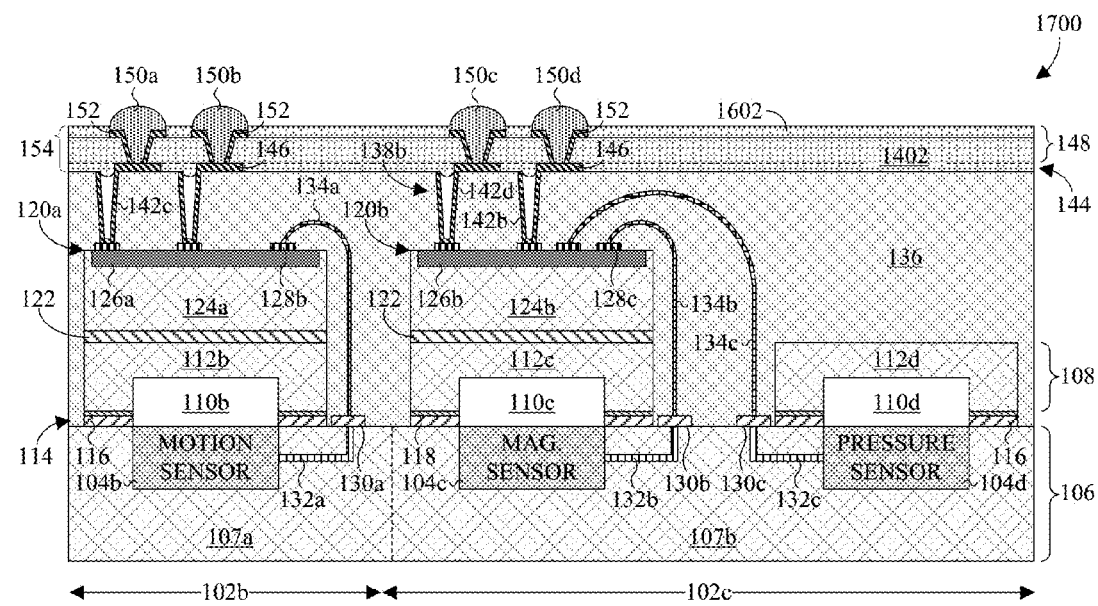

FIGS. 15-17 respectively illustrate cross-sectional views 1500, 1600, 1700 of some embodiments corresponding to Action 324.

As shown by FIG. 15, BGA holes 1502a-d are formed in the RDL bonding layer 1402. The BGA holes 1502 can, for example, be formed by performing an etch through portions of the RDL bonding layer 1402. Also shown by FIG. 15, a second conductive layer 1504 is conformally formed over the top surface of the RDL bonding layer 1402 and lining the BGA holes 1502.

As shown by FIG. 16, the second conductive layer 1504 is selectively patterned to form a BGA conductive structure 152 electrically connecting with the RDL conductive structure 146 and lining the BGA holes 1502. Also show by FIG. 16, a BGA bonding layer 1602 is formed over the BGA conductive structure 152 and filling the BGA holes 1502. The BGA bonding layer 1602 is, for example, an epoxy. The BGA bonding layer 1602 and the RDL bonding layer 1402 collectively form a RDL/BGA bonding structure 154.

As shown by FIG. 17, the BGA bonding layer 1602 is etched to clear the BGA holes 1502 and expose the BGA conductive structure 152. Further, solder balls 150a-d are formed in the cleared BGA holes 1502 over the BGA conductive structure 152. The solder balls 150 electrically connect to the ASICs 126 by way of the BGA conductive structure 162, the RDL 144, the TMVs 138, and the ASIC bond pads 128. The BGA conductive structure 152 and the solder balls 150 collectively define a BGA 148.

Figure 18:
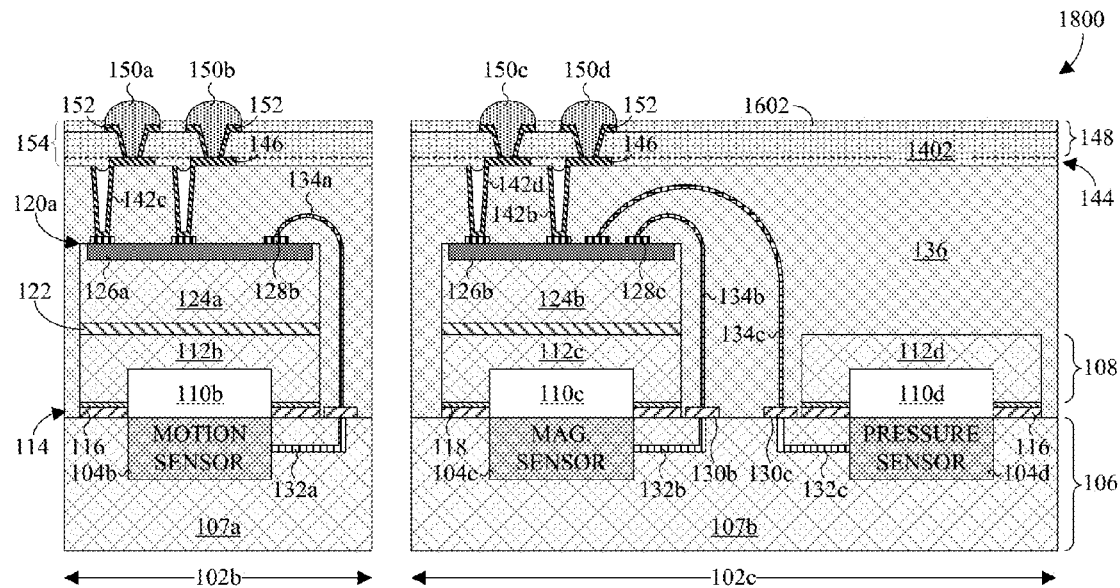

FIG. 18 illustrates a cross-sectional view 1800 of some embodiments corresponding to Action 326. As shown by FIG. 18, the resulting structure comprised of the MEMS wafer 106, the cap wafer 108, the ASIC dies 120, the housing 136, the RDL 144, and the BGA 148 is diced or singulated to separate or space the MEMS packages 102. Each MEMS package 102 includes at least one ASIC die 120, at least one MEMS device 104, and a substrate (i.e., the portion 107 of the MEMS wafer 106 corresponding to the MEMS package 102).

With reference to FIGS. 19-26, cross-sectional views 1900-2600 of alternative embodiments corresponding to Actions 316-326 are illustrated. In contrast with the embodiments of FIGS. 11-18, wire bonds are not employed to connect a MEMS wafer to ASIC dies. Rather, TMVs are employed.

Figure 19:
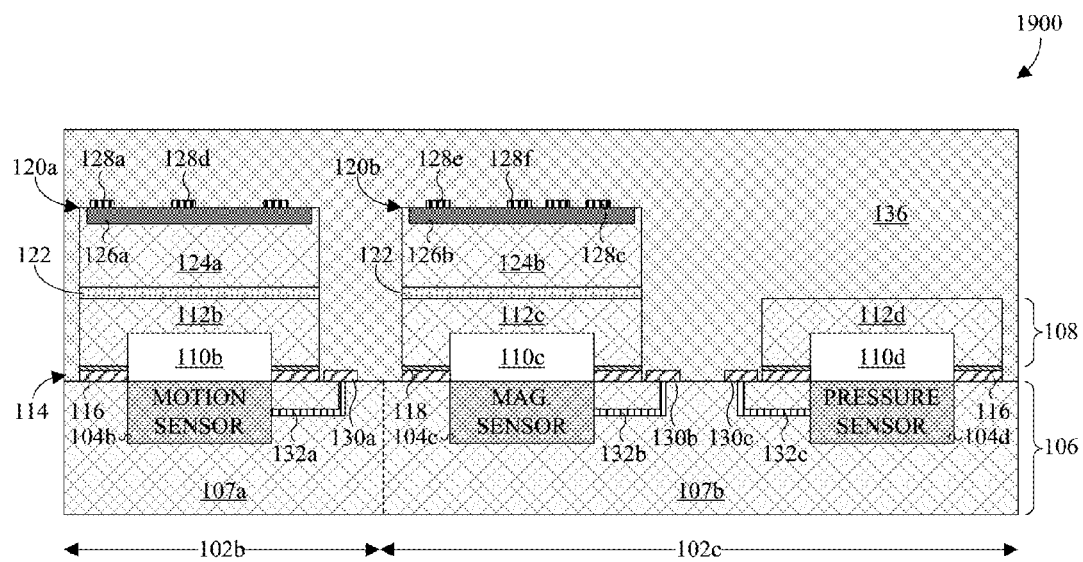

FIG. 19 illustrates a cross-sectional view 1900 of some embodiments corresponding to Actions 316 and 318. As shown by FIG. 19, a housing 136 is formed over and around the cap wafer 108, the MEMS wafer 106, and the ASIC dies 120. The housing 136 is typically formed by a molding process in which a molding material is formed and subsequently thinned down or planarized down.

Figure 20:
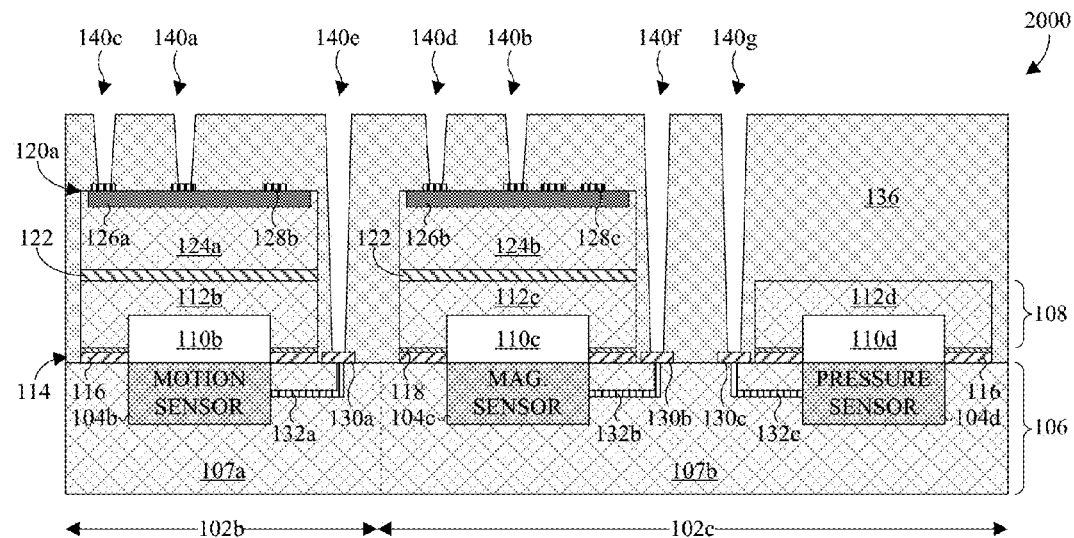
Figure 21:
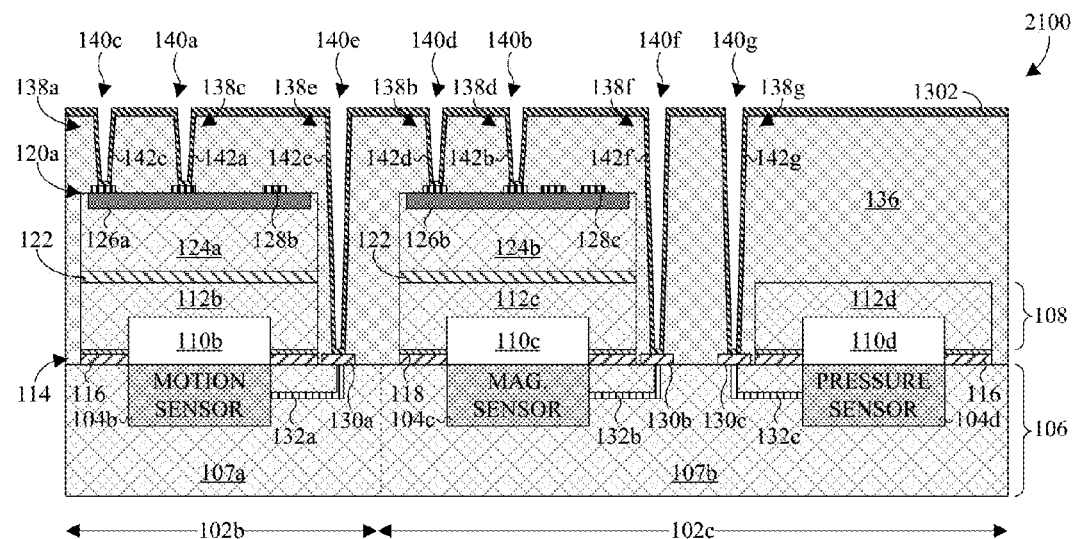

FIGS. 20 and 21 respectively illustrate cross-sectional views 2000, 2100 of some embodiments corresponding to Action 320. As shown by FIG. 20, TMV holes 140*a-g* are formed through portions of the housing 136 to ASIC bond pads 128 facilitating an electrical connection with the ASICs 126 and to MEMS bond pads 130 facilitating an electrical connection to the MEMS devices 104. The TMV holes 140 can, for example, be formed by performing an etch through the portions of the housing 136. As shown by FIG. 21, a first conductive layer 1302 is conformally formed over the top surface of the housing 136 and lining the TMV holes 140. In other embodiments, the first conductive layer 1302 can be formed over the top surface of the housing 136 and filling the TMV holes 140. Portions of the first conductive layer 1302 lining or otherwise filling the TMV holes 140 define TMV interconnects 142*a-g*. The TMV holes 140 and the TMV interconnects 142 collectively define TMVs 138*a-g* electrically connecting to the ASIC dies 120.

Figure 22:
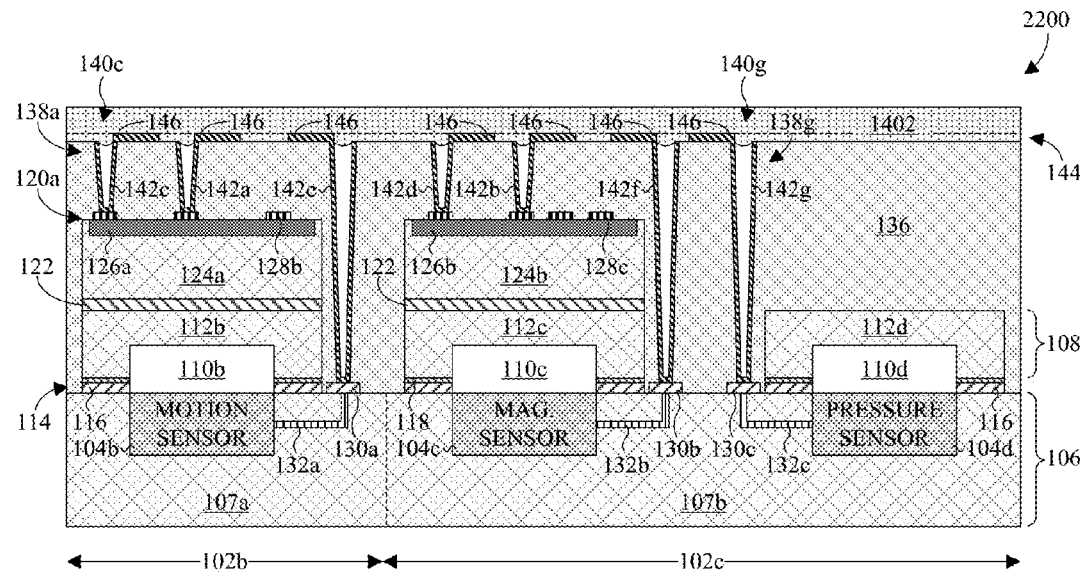

FIG. 22 illustrates a cross-sectional view 2200 of some embodiments corresponding to Action 322. As shown by FIG. 22, the first conductive layer 1302 is selectively patterned to form a RDL 144 having a RDL conductive structure 146 over the top surface of the housing 136. The RDL 144 electrically connects with ASICs 126 by way of the TMVs 138 and the ASIC bond pads 128, and distributes electrical connection points to the ASICs 126 across the top surface of the housing 136 with the RDL conductive structure 146. Also show by FIG. 22, an RDL bonding layer 1402 is formed over the RDL 144. The RDL bonding layer 1402 is, for example, an epoxy.

FIGS. 23-27 respectively illustrate cross-sectional views 2300, 2400, 2500 of some embodiments corresponding to Action 324.

Figure 23:
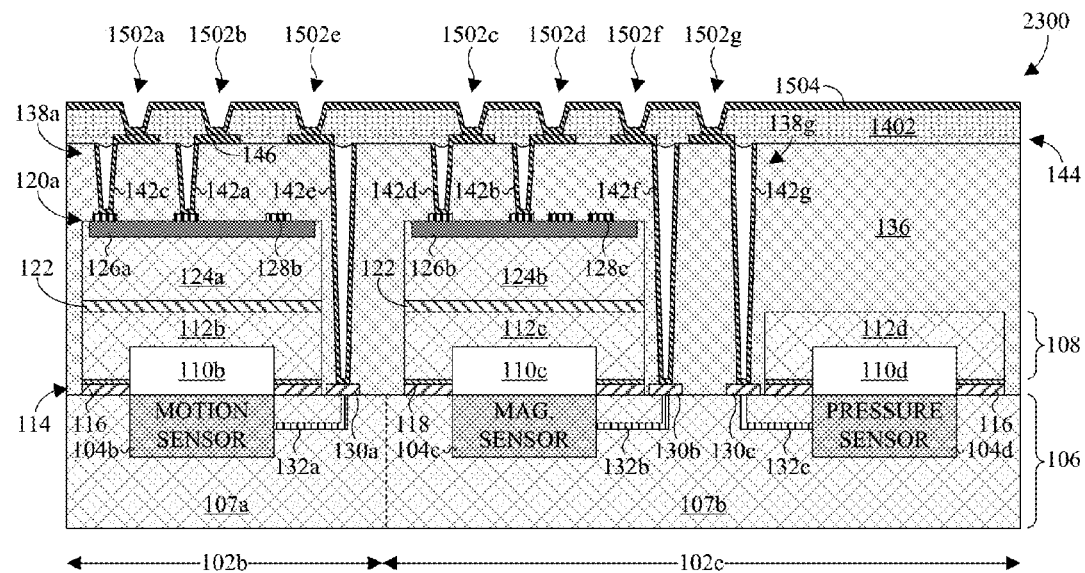

As shown by FIG. 23, BGA holes 1502*a-g* are formed in the RDL bonding layer 1402. The BGA holes 1502 can, for example, be formed by performing an etch through portions of the RDL bonding layer 1402. Also shown by FIG. 23, a second conductive layer 1504 is conformally formed over the top surface of the RDL bonding layer 1402 and lining the BGA holes 1502.

Figure 24:
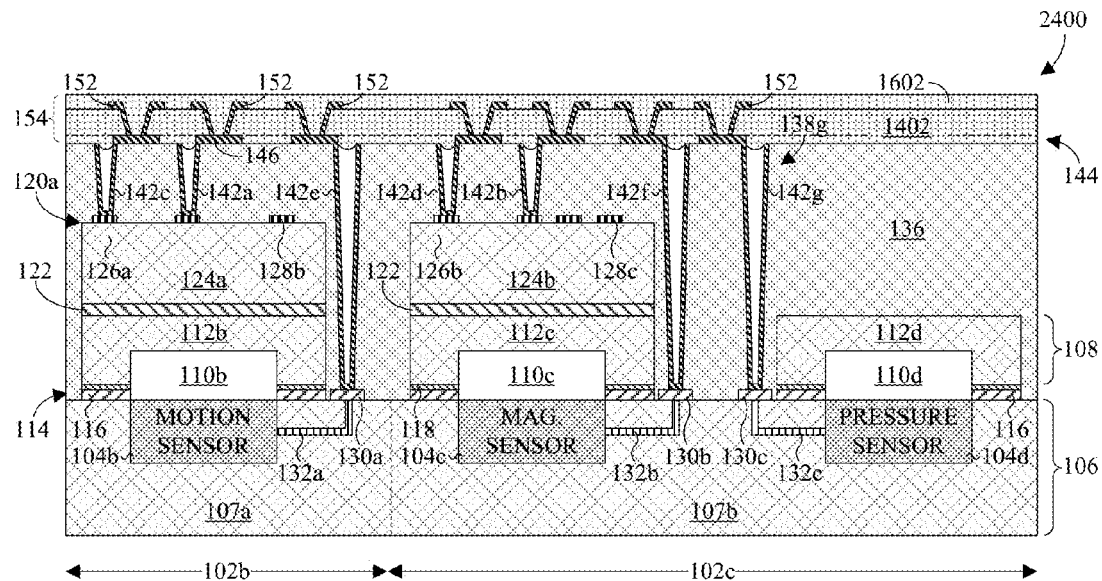

As shown by FIG. 24, the second conductive layer 1504 is selectively patterned to form a BGA conductive structure 152 electrically connecting with the RDL conductive structure 146 and lining the BGA holes 1502. Also show by FIG. 24, a BGA bonding layer 1602 is formed over the BGA conductive structure 152 and filling the BGA holes 1502. The BGA bonding layer 1602 is, for example, an epoxy. The BGA bonding layer 1602 and the RDL bonding layer 1402 collectively form a RDL/BGA bonding structure 154.

Figure 25:
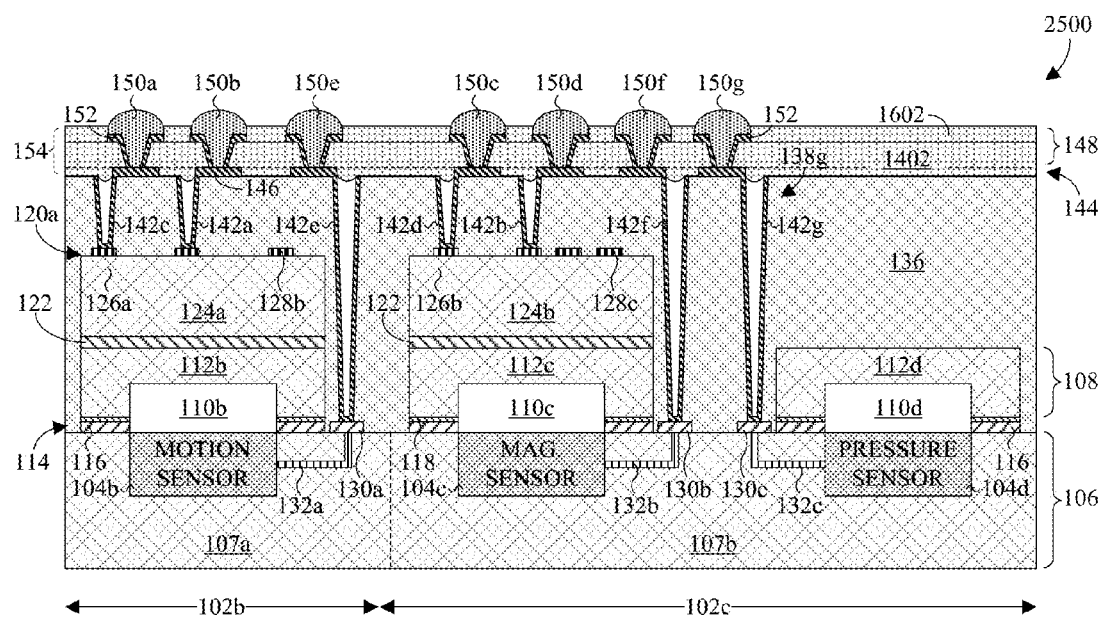

As shown by FIG. 25, the BGA bonding layer 1602 is etched to clear the BGA holes 1502 and expose the BGA conductive structure 152. Further, solder balls 150*a-g* are formed in the cleared BGA holes 1502 over the BGA conductive structure 152. The solder balls 150 electrically connect to the ASICs 126 by way of the BGA conductive structure 162, the RDL 144, the TMVs 138, and the ASIC bond pads 128. The BGA conductive structure 152 and the solder balls 150 collectively define a BGA 148.

Figure 26:
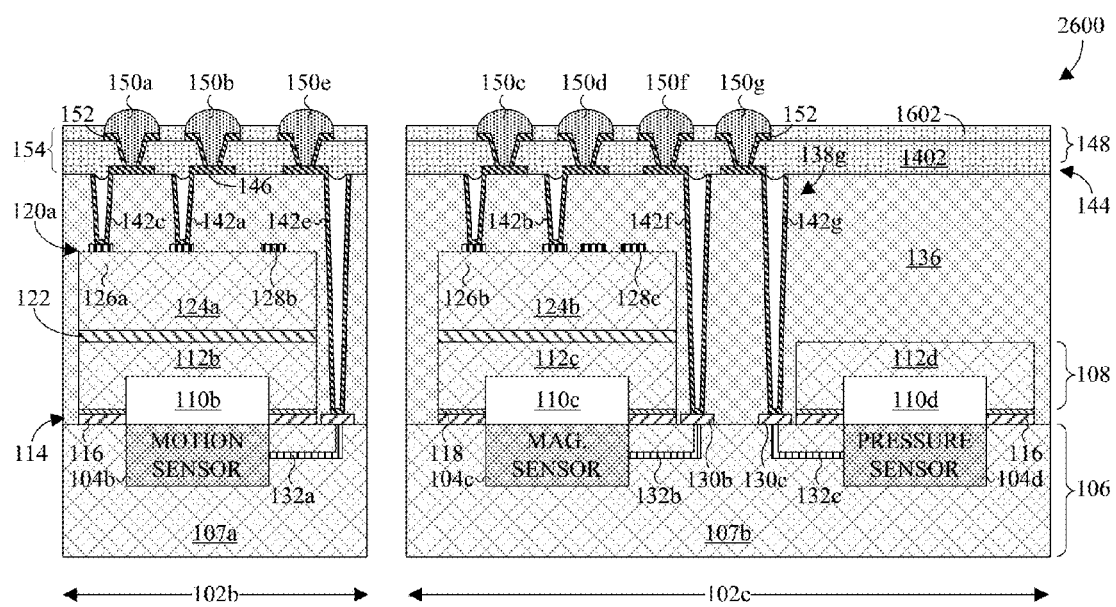

FIG. 26 illustrates a cross-sectional view 2600 of some embodiments corresponding to Action 326. As shown by FIG. 26, the resulting structure comprised of the MEMS wafer 106, the cap wafer 108, the ASIC dies 120, the housing 136, the RDL 144, and the BGA 148 is diced or singulated to separate or space the MEMS packages 102. Each MEMS package 102 includes at least one ASIC die 120, at least one MEMS device 104, and a substrate.

Thus, as can be appreciated from above, the present disclosure provides a MEMS package. A MEMS substrate has a MEMS device. A cap substrate is secured to a top surface of the MEMS substrate. The cap substrate includes a recess corresponding to the MEMS device in a bottom surface of the cap substrate. An integrated circuit die is secured to a top surface of the cap substrate over the recess. A molded housing covers the MEMS substrate, the cap substrate, and the integrated circuit die. A TMV is electrically coupled with the integrated circuit die and extends between a top surface of the housing and the integrated circuit die.

In other embodiments, the present disclosure provides a method for packaging a MEMS device. A MEMS wafer having a MEMS device is provided. A cap wafer is secured to a top surface of the MEMS wafer. The cap wafer includes a recess corresponding to the MEMS device in a bottom surface of the cap wafer. An integrated circuit die is secured to a top surface of the cap wafer over the recess. A housing covering the MEMS wafer, the cap wafer, and the integrated circuit die is formed. A TMV electrically coupled with the integrated circuit die and extending between a top surface of the housing and the integrated circuit die is formed.

In yet other embodiments, the present disclosure provides a plurality of MEMS packages. A MEMS substrate has a first MEMS device and a second MEMS device. A cap substrate is secured to a top surface of the MEMS substrate. The cap substrate includes a first recess corresponding to the first MEMS device in a bottom surface of the cap substrate. The cap substrate further includes a second recess corresponding to the second MEMS device in the bottom surface of the cap substrate. A first integrated circuit die is secured to a top surface of the cap substrate over the first recess. A second integrated circuit die is secured to the top surface of the cap substrate over the second recess. A housing covers the MEMS substrate, the cap substrate, and the first and second integrated circuit dies. A first TMV is electrically coupled with the first integrated circuit die and extends between a top surface of the housing and the first integrated circuit die. A second TMV is electrically coupled with the second integrated circuit die and extends between the top surface of the housing and the second integrated circuit die. A first MEMS package includes the first MEMS device, the first recess, the first integrated circuit die, and the first TMV. A second MEMS package includes the second MEMS device, the second recess, the second integrated circuit die, and the second TMV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) package comprising:
    a MEMS substrate having a MEMS device and a second MEMS device spaced from the MEMS device; a cap substrate secured to a top surface of the MEMS substrate, the cap substrate including a recess corresponding to the MEMS device in a bottom surface of the cap substrate;
    an integrated circuit die secured to a top surface of the cap substrate over the recess;
    a molded housing covering the MEMS substrate, the cap substrate, and the integrated circuit die, wherein the molded housing comprises an opening extending from a top surface of the molded housing to the integrated circuit die;
    a through mold via (TMV) electrically coupled with the integrated circuit die and extending between the top surface of the molded housing and the integrated circuit die, wherein the TMV conformally lines the opening to partially fill the opening;
    a second cap substrate including a second recess corresponding to the second MEMS device;
    a wire bond connected between the integrated circuit die and the MEMS substrate to electrically couple the MEMS device to the integrated circuit die; and
    a second wire bond connected between the integrated circuit die and the MEMS substrate to electrically couple the second MEMS device to the integrated circuit die.

2. The MEMS package according to claim 1, wherein the MEMS device is one of a motion sensor, a magnetic sensor, and a pressure sensor.

3. The MEMS package according to claim 1, further including:
    a chamber corresponding to the MEMS device, wherein the chamber includes the recess and is arranged over and abutting the MEMS device between the MEMS substrate and the cap substrate, and wherein the integrated circuit die is arranged over the chamber.

4. The MEMS package according to claim 1, wherein the cap substrate and the second cap substrate are spaced.

5. The MEMS package according to claim 1, further including:
    a second TMV electrically coupled to the MEMS device and extending between the top surface of the molded housing and the MEMS substrate.

6. The MEMS package according to claim 1, further including:
    a redistribution layer (RDL) arranged over the top surface of the molded housing and electrically coupled with the TMV; and
    a ball grid array (BGA) arranged over the RDL and electrically coupled with the integrated circuit die by way of the TMV and the RDL.

7. A microelectromechanical system (MEMS) package comprising:
    a MEMS substrate having a first MEMS device and a second MEMS device; a cap substrate secured to a top surface of the MEMS substrate, wherein the cap substrate includes a first cap and a second cap, wherein the first cap includes a first recess corresponding to the first MEMS device in a bottom surface of the cap substrate, and wherein the second cap includes a second recess corresponding to the second MEMS device in the bottom surface of the cap substrate;
    a integrated circuit die secured to a top surface of the first cap over the first recess;
    a housing covering the MEMS substrate, the cap substrate, and the integrated circuit die; and
    a through mold via (TMV) electrically coupled with the integrated circuit die and extending between a top surface of the housing and the integrated circuit die;
    wherein the second cap is not covered by an integrated circuit die.

8. The MEMS package according to claim 1, wherein footprints of the cap substrate and the integrated circuit die are substantially the same.

9. The MEMS package according to claim 7, further comprising:
    a wire bond connected between the integrated circuit die and the MEMS substrate to electrically couple the first MEMS device to the integrated circuit die.

10. The MEMS package according to claim 7, further comprising:
    a first wire bond connected between the integrated circuit die and the MEMS substrate to electrically couple the first MEMS device to the integrated circuit die; and
    a second wire bond connected between the integrated circuit die and the MEMS substrate to electrically couple the second MEMS device to the integrated circuit die.

11. The MEMS package according to claim 7, further comprising:
    a second TMV electrically coupled to the first MEMS device and the integrated circuit, and extending between the top surface of the housing and the MEMS substrate.

12. The MEMS package according to claim 7, further comprising:
    a second TMV electrically coupled to the first MEMS device and the integrated circuit, and extending between the top surface of the housing and the MEMS substrate; and
    a third TMV electrically coupled to the second MEMS device and the integrated circuit, and extending between the top surface of the housing and the MEMS substrate.

13. A microelectromechanical system (MEMS) package comprising:
    a MEMS substrate comprising a MEMS device;
    a cap arranged over the MEMS substrate and comprising a recess opening to the MEMS device;
    an integrated circuit die arranged over the cap and the recess;
    a molded housing covering and laterally surrounding the cap and the integrated circuit die;

a first through mold via (TMV) electrically coupled with the integrated circuit die and extending between an upper surface of the molded housing and the integrated circuit die; and a second TMV electrically coupled to the MEMS device, and extending between the upper surface of the molded housing and the MEMS substrate.

14. The MEMS package according to claim 13, further comprising:

a wire bond electrically coupled between the integrated circuit die and the MEMS device.

15. The MEMS package according to claim 13, further comprising:

a redistribution layer (RDL) arranged over the upper surface of the molded housing and electrically coupling the first TMV and the second TMV.

16. The MEMS package according to claim 1, wherein the TMV laterally surrounds an unfilled region of the opening.

17. The MEMS package according to claim 16, further comprising:

a redistribution layer (RDL) arranged over the top surface of the molded housing and electrically coupled with the TMV, wherein the RDL seals the unfilled region of the opening.

18. The MEMS package according to claim 7, further comprising:

a redistribution layer (RDL) arranged over the top surface of the housing and electrically coupled with the integrated circuit through the TMV; and a second TMV extending between the top surface of the housing and the MEMS substrate, wherein a first end of the second TMV is electrically coupled to the first or second MEMS device through a MEMS bond pad on the MEMS substrate, and wherein a second end of the second TMV is electrically coupled to the integrated circuit die through the RDL.

* * * * *